US012607697B1

(12) United States Patent
Carinci et al.

(10) Patent No.: US 12,607,697 B1
(45) Date of Patent: Apr. 21, 2026

(54) METHOD FOR ACQUIRING A MAGNETIC RESONANCE IMAGE WITH AN EXTENDED FIELD OF VIEW

(71) Applicant: Siemens Healthineers AG, Forchheim (DE)

(72) Inventors: Flavio Carinci, Wuerzburg (DE); Stefanie Splitthoff, Uttenreuth (DE)

(73) Assignee: SIEMENS HEALTHINEERS AG, Forchheim (DE)

( * ) Notice: Subject to any disclaimer, the term of this patent is extended or adjusted under 35 U.S.C. 154(b) by 0 days.

(21) Appl. No.: 19/245,871

(22) Filed: Jun. 23, 2025

(30) Foreign Application Priority Data

Jun. 24, 2024 (DE) ..................... 10 2024 205 850.5

(51) Int. Cl.
*G01R 33/565* (2006.01)
*G01R 33/48* (2006.01)
*G01R 33/483* (2006.01)

(52) U.S. Cl.
CPC ..... *G01R 33/56563* (2013.01); *G01R 33/481* (2013.01); *G01R 33/4833* (2013.01); *G01R 33/56572* (2013.01)

(58) Field of Classification Search
CPC ............ G01R 33/56563; G01R 33/481; G01R 33/4833; G01R 33/56572
See application file for complete search history.

(56) References Cited

U.S. PATENT DOCUMENTS 8,054,079 B2 11/2011 Hebrank et al.
2011/0187364 A1 8/2011 Blumhagen et al.
(Continued)

FOREIGN PATENT DOCUMENTS

DE 102010006431 A1 8/2011
DE 102010044520 A1 3/2012

OTHER PUBLICATIONS

Blumhagen JO et al.:"Field of view extension and truncation correction for MR-based human attenuation correction in simultaneous MR/PET imaging" Med Phys. Feb. 2014;41(2):022303. doi: 10.1118/1.4861097. PMID: 24506641.
(Continued)

*Primary Examiner* — Rishi R Patel
(74) *Attorney, Agent, or Firm* — Harness, Dickey & Pierce, P.L.C.

(57) ABSTRACT

A method for magnetic resonance imaging, the method comprising: provisioning a distortion correction function for an extended field of view; provisioning an optimized position along the slice selection direction, wherein the static magnetic field has a high level of homogeneity within the slice at the optimized position in a region in the periphery of the field of view; provisioning an optimized readout gradient, wherein a strength and polarity of the optimized readout gradient are selected so that distortions in the magnetic resonance image caused by inhomogeneities in the static magnetic field and distortions caused by non-linearities in the readout gradient field are superimposed within the region; acquiring the magnetic resonance image at the optimized position along the slice selection direction with the optimized readout gradient; and performing distortion correction on the acquired magnetic resonance image using the distortion correction function.

21 Claims, 4 Drawing Sheets

(56) References Cited

U.S. PATENT DOCUMENTS

| | | |
|---|---|---|
| 2012/0056621 A1 | 3/2012 | Blumhagen et al. |
| 2013/0057282 A1* | 3/2013 | Blumhagen ...... G01R 33/56572 |
| | | 324/309 |
| 2013/0082702 A1* | 4/2013 | Blumhagen ...... G01R 33/56563 |
| | | 324/309 |
| 2013/0237806 A1* | 9/2013 | Blumhagen ...... G01R 33/56572 |
| | | 600/411 |

OTHER PUBLICATIONS

Blumhagen J. O. et al; "MR-Based Field-of-View Extension in MR/PET: B0 Homogenization Using Gradient Enhancement (HUGE)"; Magnetic Resonance in Medicine; vol. 70; pp. 1047-1057; 2013.

Lindemann ME et al.:"MR-based truncation correction using an advanced HUGE method to improve attenuation correction in PET/MR imaging of obese patients" Med Phys. Feb. 2022;49(2):865-877. doi: 10.1002/mp.15446. Epub Jan. 25, 2022. PMID:35014697.

German Office Action and English translation thereof for German Application No. 10 2024 205 850.5 mailed Mar. 15, 2025.

German Decision to Grant and English translation thereof for German Application No. 10 2024 205 850.5 mailed May 19, 2025.

* cited by examiner

FIG 1

METHOD FOR ACQUIRING A MAGNETIC RESONANCE IMAGE WITH AN EXTENDED FIELD OF VIEW

CROSS-REFERENCE TO RELATED APPLICATION(S)

The present application claims priority under 35 U.S.C. § 119 to German Patent Application No. 10 2024 205 850.5, filed Jun. 24, 2024, the entire contents of which is incorporated herein by reference.

BACKGROUND

Independent of the grammatical term usage, individuals with male, female or other gender identities are included within the term.

Positron emission tomography (PET) is an important modality for functional imaging. Due to its low spatial resolution, it is often combined with another, high-resolution imaging modality, for example, with computed tomography (CT) or with magnetic resonance imaging (MRI), wherein both imaging modalities are combined into a single whole-body clinical system for simultaneous acquisition of CT or MRI and PET images. Integrated magnetic resonance (MR)/PET systems offer an outstanding tissue contrast and substantially reduce the radiation dose. MR/PET is therefore increasingly used for diagnostic purposes, but also for planning and monitoring radiotherapy. The accuracy and reproducibility of PET images, which were taken with an MR/PET system, are thus of the utmost significance for the planning and performance of radiotherapy.

With quantitative positron emission tomography (PET) or with MR-based radiotherapy planning, it is extremely important to accurately measure and compensate for the attenuation of the photons absorbed in the tissue. If PET is combined with another imaging method, it is usual to create an image of the body part first with the other method and to use this image to produce an attenuation correction map (AC map), which can then be used to correct the PET data. With MR/PET systems or with MR-based methods for radio-therapy planning (such as with synthetic CT), the map of attenuation coefficients is thus calculated on the basis of a magnetic resonance image. Magnetic resonance systems have an inherently limited field of view, however, as the static magnetic field (B0 field) is only sufficiently homogeneous within a specific sensitive area in the magnetic resonance tomograph (MRT). The same applies to the magnetic gradient fields, which are likewise only truly linear within a central sensitive area. Outside and in the periphery of the sensitive area, magnetic field inhomogeneities and gradient non-linearities cause image distortions in MR imaging. An MR-based AC map at the edges of the field of view can thus be distorted, which means that a PET image or synthetic CT image corrected with an MR-based AC map can be inaccurate. This effect is particularly strong at the edges of the field of view in the right-left direction, where the patient's arms usually lie.

A fully MR-based method for extending the conventional MR field of view (FOV), the so-called B0 homogenization using gradient enhancement (HUGE, B0), was proposed and is described in the following publications: Blumhagen J O, Ladebeck R, Fenchel M, Scheffler K "MR-based field-of-view extension in MR/PET: B0 homogenization using gradient enhancement (HUGE)." Magn Reson Med. 2013 October; 70 (4): 1047-57. doi: 10.1002/mrm.24555. Epub 2012 Nov. 30. PMID: 23203976 and Blumhagen J O, Braun H, Ladebeck R, Fenchel M, Faul D, Scheffler K, Quick H H. "Field of view extension and truncation correction for MR-based human attenuation correction in simultaneous MR/PET imaging." Med Phys. 2014 February; 41 (2): 022303. doi: 10.1118/1.4861097. PMID: 24506641.

With this method, the amplitude of the readout gradient is optimized during image acquisition for the two sides of the body, in order to compensate locally for the B0 field inhomogeneity, resulting in the least possible distortion and thus extending the FOV. The method is based on the fact that B0 field inhomogeneities and gradient non-linearities can be superimposed in a compensatory way by selecting a suitable readout gradient strength and polarity. This is possible because the gradient error field scales linearly with the gradient amplitude, while the B0 field inhomogeneity is independent of the gradient amplitude.

Depending on the properties of the underlying B0 and gradient fields, substantial distortion can, however, remain with the method proposed by Blumhagen et al.

SUMMARY

It is an object of one or more example embodiments of the present invention to provide a method for planning and performing an MR acquisition with an extended field of view, which can be used to achieve an additional improvement in relation to image quality. A further aim is to provide a method that responds less sensitively to production variations.

One or more example embodiments of the present invention resolve at least the above-mentioned object with a method for acquiring a magnetic resonance image, a computer program, a non-transitory computer-readable medium and a magnetic resonance tomograph as claimed and described here.

According to a first aspect, one or more example embodiments of the present invention are directed to a method for acquiring a magnetic resonance image with a field of view extended in at least one direction, wherein the magnetic resonance image is acquired with a magnetic resonance tomograph, which is able to produce, in the extended field of view, a static magnetic field and magnetic gradient fields extending in a slice selection direction, a readout direction, and at least one phase encoding direction, wherein during the acquisition an MR signal is acquired from signal-generating spins in the extended field of view, and wherein the method comprises the following steps:

(a) provision of a distortion correction function for the extended field of view, (b) provision of at least one optimized position along the slice selection direction, wherein the static magnetic field has a high level of homogeneity within the slice at the optimized position in at least one predetermined region in the periphery of the field of view, wherein the optimized position is optionally optimized to the effect that artifacts due to signal-generating spins outside the slice are minimized, (c) provision of an optimized readout gradient, wherein the strength and polarity of the optimized readout gradient are selected so that distortions in the magnetic resonance image caused by inhomogeneities in the static magnetic field and distortions caused by non-linearities in the readout gradient field are superimposed in a compensatory way within the at least one predetermined region, (d) acquisition of the magnetic resonance image at the optimized position along the slice selection direction with the optimized readout gradient, and (e) performance of distortion correction on the acquired magnetic resonance image using the distortion correction function.

One or more example embodiments of the present invention are thus based on a 2-stage optimization process: in a first stage an optimal position along the slice selection direction is used, at which the static magnetic field has extremely high homogeneity within the selected slice, in particular in at least one region in the periphery of the field of view, in other words in an edge region. In a second stage, a readout gradient for the selected slice at the optimal position is provided in such a way that distortions are compensated, especially in the edge region of the field of view. The cited HUGE technique can be used for this, for example. The two articles by Blumhagen et al. cited here are hereby included in this disclosure. In both stages, optimization is preferably carried out using a distortion correction function extended to an extended field of view.

One or more example embodiments of the present invention are based on the knowledge that the static magnetic field does not have the best homogeneity particularly along the z-direction, but also in the other directions, with most magnetic resonance tomographs in the highly peripheral regions at the central position z=0 (hereafter also referred to as the isocenter). This is due to the design of the main magnets, whose static magnetic field (also referred to as the main magnetic field) generally has many small fluctuations at the edges of the field of view with relatively strong local maximums and minimums. On a coronal MR image these B0 inhomogeneities are visible due to local compressions and expansions at the edges of the field of view. At the position z=0 (isocenter) a strong expansion effect is typically seen, while the distortion takes the form of a compression slightly further along the z-direction, i.e., parallel to the static magnetic field. According to one or more example embodiments of the present invention, a position along the slice selection direction, typically along the z-direction, is selected, at which the expansion and compression are evenly balanced at the edges of the field of view, with the result that the static magnetic field has high homogeneity locally within this slice.

Minimizing signal contributions from spins outside the selected slice position is another optional criterion when selecting the optimal position in the slice selection direction. This can occur if the local assignment of frequency in the slice selection direction is not clear, e.g., because of the non-optimal properties of the B0 field and of the gradient field in the slice selection direction (particularly the z-direction). MR signals from spins that are outside the selected slice can contribute to the signal and cause artifacts. According to one embodiment variant, the position in the slice selection direction is thus selected so as to minimize or avoid these unwanted signal contributions. In particular, the slice position is optimized in such a way that homogeneity within the slice is maximized and unwanted signal contributions from outside the slice are minimized simultaneously.

Then in a second step, an optimized readout gradient is determined for this slice at the optimized slice position, namely both the strength and polarity of the readout gradient are selected so that the distortions caused by inhomogeneities in the static magnetic field and distortions caused by non-linearity of the readout gradient field within a predetermined region are superimposed in a compensatory way. The predetermined region is in the periphery of the field of view, in other words at the edge of the extended field of view. According to one embodiment variant, the properties of the slice selection gradient, in particular its polarity and strength or amplitude, are also selected so as to minimize signal contributions from spins outside the selected slice position.

An "extended field of view" here means a field of view that is enlarged compared to a standard field of view of the magnetic resonance tomograph, also referred to as the MR device. In particular, a "standard" field of view means the maximum, conventional field of view of the MR device. This has, e.g., the approximate form of a sphere with the center in the isocenter. The sphere typically has a diameter of approx. 50-55 cm. The extended field of view is then enlarged at least along one axis by, e.g., 2-7 cm, preferably 4-6 cm, preferably by half in each instance at both peripheral ends. The field of view is preferably extended at least in the x-direction and/or the y-direction. In one embodiment variant, the extended field of view has the approximate form of a sphere with a diameter of 55 to 62, preferably 58 to 60 cm. In some embodiment variants, the predetermined region and/or the periphery of the field of view are outside the "standard field of view," but within the extended field of view. The periphery is thus the region by which the extended field of view is extended compared to the standard field of view.

According to one or more example embodiments of the present invention, distortion correction is performed on the acquired magnetic resonance image. This is done in particular on the basis of distortion correction for the extended field of view. I.e., the MR image in the periphery is also distortion-corrected. Such a distortion correction function can be used to mathematically correct MR images that have already been reconstructed, so that they better reflect the scanned object geometry. Such distortion correction functions often use the spatial distribution of the gradient fields, also referred to here as gradient field maps, and in particular the non-linear field components, which in turn can be measured or calculated from the geometry of the gradient coils of the MR scanner. A suitable method for correcting distortion is disclosed in U.S. Pat. No. 8,054,079 B2, for example. Such distortion correction functions are routinely present in clinical MR devices and are used automatically to correct distortion in MR images in the (standard) field of view of the MR device.

A distortion correction function for the extended field of view is provided according to one or more example embodiments of the present invention. This can be achieved in different ways. Extended gradient field maps are used according to a first method. The extended gradient field maps cover the extended field of view. The extended gradient field maps can be obtained in different ways. For example, they can be simulated or calculated from the geometry of the gradient coils of the MR device. According to another embodiment variant, the extended gradient field maps are extrapolated from maps of the gradient fields for the standard field of view. For example, the gradient fields can be extrapolated from a sphere with a diameter of 55 cm to a sphere with a diameter of 60 cm. The image data of the magnetic resonance image can then be distortion-corrected with the coefficients that model these fields. According to a second method, the distortion correction function routinely provided in the MR device is extended or extrapolated to the extended field of view. This can be achieved by extrapolating the coefficients of the distortion correction function to the extended field of view.

No distortion correction is performed with the HUGE method, because it is assumed here that B0 inhomogeneities and gradient non-linearities can compensate each other 1:1. This assumption is only tenable, however, if they are both the same size and have a similar spatial course, which is often not the case. Accordingly, distortion correction is additionally applied with one or more example embodiments of the present invention, namely in the extended, enlarged field of view. Optimization of the readout gradient according to step (c) is also carried out. Experiments have shown that step (c) alone does not deliver optimal results, but an outstanding result can be achieved when this is combined with the distortion correction.

The optimized position and the optimized readout gradient are then used to acquire a magnetic resonance image. Compared to the HUGE technique, this image delivers improved quality and improved geometric accuracy in particular in the periphery of the field of view. Because of the dual optimization, both in the movement in the slice selection direction and the amplitude of the readout gradient, one or more example embodiments of the present invention make the HUGE method more stable and less prone to image artifacts. One or more example embodiments of the present invention facilitate the expansion of the field of view of MR images by several cm, in particular by 2-7 cm, preferably 4-6 cm, compared to the previously used fields of view. As a result, a field of view of up to 60 cm in width, rather than the previous 55 cm, can be achieved, for example, in a clinical magnetic resonance tomograph with a tube diameter of 60 cm.

Thus, multiple optimization steps are applied according to one or more example embodiments of the present invention, which optimize the slice position on the one hand and the amplitude and polarity of the slice readout gradient on the other, as well as optionally the amplitude and polarity of the slice selection gradient. It is possible in this way to reduce image artifacts, minimize distortions, and improve the stability of the method.

A magnetic resonance image acquired in this way is preferably used to determine AC maps for the correction of PET images and MR/PET images in particular. According to another embodiment variant, it can also be used to generate MR-based synthetic CT images. In order to generate AC maps or synthetic CT images, the magnetic resonance images, according to one or more example embodiments of the present invention, can advantageously be combined with other images, for example, with a conventionally taken VIBE-DIXON image, which can be used to differentiate the various tissues (fat, water, bone).

In order to acquire a magnetic resonance image with a larger field of view, including in the slice selection direction, a slice can be acquired at the determined optimal position in each instance. Between or during the acquisitions, the patient can be moved on the patient table along the slice selection direction through the sensitive area, wherein a stack of images is acquired along the length of the body. Thus, all images are preferably acquired at the optimized position in the slice selection direction. The position of the patient table changes between the individual acquisitions, or moves continuously during the acquisition of multiple slices, in order to cover a specific area of the body. The stack of images can cover part of the patient's anatomy, e.g., the head or torso, up to a full-body scan. These images can then be amalgamated into one three-dimensional (3D) image, from which an AC map can be determined.

The successful optimizations are preferably performed only once for a type of magnetic resonance tomograph, in order to determine the hardware-specific optimized position for this type along the slice selection direction. The optimized readout gradient also depends on the used gradient coils and the main magnet and thus is preferably only determined once for a specific type of magnetic resonance tomograph. The optimal position in the slice selection direction is then known for acquiring MR images on a specific MR device and can be saved in the MR device, or can be accessed from another data memory, e.g., a remote memory, cloud, or another PC, USB stick, etc. The optimal strength and amplitude of the readout gradient and optionally of the slice readout gradient can also be saved in the MR device, or be accessed from a data memory. Alternatively, the optimizations can also be repeated at intervals to take into account any drifts in the magnetic fields.

A "magnetic resonance image with a field of view extended in at least one direction" means a two-dimensional (2D) or three-dimensional (3D) MR image, which has an extremely large field of view (FOV). The field of view is preferably extremely large in the readout direction; in particular, it has at least one predetermined region at the edges in this direction. The predetermined region is preferably outside the "standard" field of view that could be captured by conventional MR imaging without major distortions. The "periphery" means an outer region or edge region of a field of view here. The predetermined region is in one direction in particular at the edge of the field of view, wherein this direction is preferably the readout direction. In other embodiment variants, the direction can also be the phase encoding direction, however. The slice selection direction is preferably the z-direction, but embodiments of the present invention are not restricted to this. Rather, depending on the desired field of view, it can also be advantageous for the slice selection direction to be provided in the x-direction or in the y-direction. There are preferably two predetermined regions, one at each side of the field of view in each case. The advantage of this is that the edge regions on both sides can be acquired with improved quality. If the readout direction lies along a left-right direction, the two predetermined regions are arranged, for example, in the region of the outer shoulders or arms of the patient. The predetermined regions preferably form a strip at the edge of the field of view in each case.

The optimized position along the slice selection direction and/or the optimized readout gradient can be determined at least partially using a computer-implemented method. In particular, it is possible to calculate the homogeneity of the static magnetic field in the at least one predetermined region within a selected slice from the map of the static magnetic field. For example, a homogeneity metric can be determined by totaling the squares of the deviation from the mean magnetic field at a number of defined positions within the predetermined region or also within the whole selected slice. This metric can be calculated for slices at various positions along the slice selection direction. The slice with the lowest metric then has the greatest homogeneity, and the associated position along the slice selection direction is the optimized position.

Alternatively, the optimized position can also be determined experimentally. With this method, MR images of a geometrically uniform phantom, for example, are taken at various positions along the slice selection direction. The level of inhomogeneity in the static magnetic field can be determined using the quantification of distortions, and the best image or its slice position can be determined. In particular, the slice position is selected at which distortions are minimized on the one hand and, on the other, artifacts from signal-generating spins outside the slice are minimized. As the optimized position is preferably only determined once for a type of magnetic resonance device and merely accessed afterwards when executing the method, the optimized position can also be determined experimentally. This preferably involves the evaluation of MR images.

In another step, an optimized readout gradient is determined, or a determined optimized readout gradient is provided, which is used during acquisition of the magnetic resonance image at the optimized position determined in step (b). The strength and polarity of the optimized readout gradient were selected so that distortions in the magnetic resonance image caused by inhomogeneities in the static magnetic field and distortions caused by non-linearities in the readout gradient field, are superimposed in a compensatory way within the at least one predetermined region.

According to one potential embodiment variant, the optimized readout gradient is selected according to the method of Blumhagen et al. in Magn. Reson. Med. 70:1047-1057 (2013).

According to another embodiment variant, the optimized readout gradient is determined experimentally for a specific device type and is then provided for acquisitions according to one or more example embodiments of the present invention. In particular, the optimization can be effected by taking and evaluating MR images with different gradient strengths and/or polarities.

According to one preferred embodiment variant, the at least one optimized position in step (b) and/or the optimized strength and polarity of the slice selection gradient was/were determined by evaluating MR images, which were corrected for the extended field of view using the distortion correction function. In other words, it is MR images that have already been distortion-corrected that are evaluated to determine the optimized position and/or the optimized slice selection gradient. As this concerns the periphery of the field of view, the distortion correction function is preferably applied for the extended field of view for this purpose. The "gradient error" is thus first corrected mathematically using the distortion correction. The remaining distortions/artifacts are then minimized by the optimized slice position and/or by optimizing the readout gradient.

According to one embodiment variant, the readout direction is aligned along a left-right direction of a subject lying in the magnetic resonance tomograph, wherein the slice selection direction is preferably aligned along a z-direction of the magnetic resonance tomograph. The advantage of this orientation is that the field of view is extended in the left-right direction, in which many patients are wider. In particular, when imaging the torso the patient's arms lying next to the body must be taken into account when calculating the AC map. It is also advantageous if the slice selection direction is in the z-direction, as a whole-body scan of a patient can then be taken by advancing the patient table in the z-direction and repeatedly acquiring an MR image at the optimized slice position. This is especially important when planning radiotherapy.

According to one preferred embodiment variant, an optimized position along the slice selection direction was determined in step (b) so that the static magnetic field has a high level of homogeneity within the slice at the optimized position in two predetermined regions, wherein the two regions are positioned on both sides of the field of view in the readout direction. Thus, an optimized position is determined with this embodiment variant that is the same on both sides of the field of view for the predetermined regions. In other words, a single optimized position is determined for two predetermined regions. This simplifies implementation, and excellent results are usually achieved, because the main magnet is typically symmetrical.

According to one alternative embodiment variant, two optimized positions along the slice selection direction were determined so that the static magnetic field has a high level of homogeneity within a first predetermined region within a first slice at a first optimized position and a high level of homogeneity and minimized artifacts within a second predetermined region within a second slice at a second optimized position, wherein the first and the second predetermined regions are arranged on both sides of the field of view in the readout direction. Optimal slice positions are determined separately for each of the two sides with this embodiment variant. Extremely high image quality can be achieved as a result.

According to one embodiment variant, the step of determining the at least one optimized position in step (b) is performed by analyzing a different magnetic resonance image, which was taken in a plane that is aligned along the slice selection direction and the readout gradient direction, and by determining the position along the slice selection direction, in which a distortion of the magnetic resonance image is minimal in the periphery of the field of view in the readout direction. This allows the determination of the optimal slice position, at which there is neither expansion nor compression of the image. This can be effected in particular by analyzing a magnetic resonance image of a phantom with known geometry.

According to one embodiment variant, step (c) of determining an optimized readout gradient by applying B0 homogenization using gradient enhancement (HUGE) is performed as described in the two cited articles by Blumhagen et al. This allows a considerable reduction in distortions at the edge of the field of view. The optimal polarity of the readout gradient is typically opposite for the two sides of the magnet.

According to one embodiment variant, the optimized readout gradient is determined separately for both sides in step (c). This means that the two sides have to be acquired separately during acquisition of the magnetic resonance image. For example, one side can be scanned first and then the other, and the images at the same slice position are then amalgamated in a post-processing step.

According to one embodiment variant, the method comprises an additional step of providing an optimized slice selection gradient with respect to a predetermined slice thickness, which is to be used during acquisition of the magnetic resonance image, wherein the strength and polarity of the slice selection gradient are optimized so that no interfering signal from spins outside this slice enters the slice. A third parameter is thereby also optimized, namely the amplitude and polarity of the slice selection gradient, thus typically the gradient in the z-direction. The amplitude of this gradient depends both on the slice thickness and on the duration of the radio frequency (RF) pulses. With the desired slice thickness, the RF pulse duration should be adjusted so that the desired gradient amplitude is achieved. Optimization of the gradient amplitude and polarity in the z-direction is another improvement of the proposed method, as this parameter influences the position in z, at which the compression and expansion effects described above occur. This means that both the B0 inhomogeneities and the gradient amplitude and polarity in the z-direction determine the optimal position in the z-direction. Moreover, the non-linearities of the gradient can cause an unwanted signal distortion in the outer parts of the sensitive area, which can be reduced by increasing the amplitude of the slice selection gradient. Before the optimal position in the z-direction is determined, the distortion of a phantom with known geometry can, as described above, be measured with both polarities of the slice selection gradient. The polarity with the least distortions can then be used, and the optimal position in the z-direction and the readout gradient are determined on the basis thereof.

A spin-echo sequence is preferably used to acquire the magnetic resonance image of a slice at the at least one optimized position along the slice selection direction and using the optimized readout gradient. With this method, the optimized slice position determined at an earlier point and the optimized readout gradient can be used to take a magnetic resonance image. This can be a 2D image or a 3D image. A series of 2D images in particular is preferably taken at once while the subject is moved in the slice selection direction. This allows a stack of magnetic resonance images to be acquired with the extended field of view. The subject is preferably a human or animal, for example, a patient. The field of view can map any anatomy of the subject. The sequence is preferably of the spin-echo type, i.e., a sequence with an excitation pulse followed by one or more refocusing pulses. This is preferably a turbo-spin-echo sequence.

According to one embodiment variant, a magnetic resonance image is acquired separately on both sides in the readout direction for each of the two predetermined regions at the edge of the field of view. This facilitates the use of an optimized readout gradient for each side, particularly with optimized polarity.

The acquired magnetic resonance image is also preferably post-processed via distortion correction methods, in order to improve the results still further. These are usually applied during image reconstruction towards the end of the reconstruction chain. These distortion correction methods are typically based on maps of the gradient fields. The maps are extended compared to conventional maps in such a way that they cover the extended field of view. The distortions arising from these maps can be foreseen and corrected accordingly.

According to one embodiment variant, a series of magnetic resonance images is acquired at the at least one optimized position along the slice selection direction, wherein the subject moves along the slice selection direction between the acquisition of the individual images in the series. This allows a larger area of the subject's body or the subject's entire body to be scanned. The series of magnetic resonance images can be amalgamated into one overall image, from which in turn an AC map can be derived. Such an AC map is preferably used to correct PET images or to generate MR-based synthetic CT images for radiation treatment planning. Accordingly, one or more example embodiments of the present invention are also directed to the use of a magnetic resonance image produced in such a way with an extended field of view, in order to produce an AC map of the subject.

According to another aspect, one or more example embodiments of the present invention are directed to a computer program with program code, which triggers a computer to execute the optimization steps described here for planning the acquisition of a magnetic resonance image. In particular, this method can employ a computer-implemented process to determine the optimized position and the optimized readout gradient from the maps of the static magnetic field and the readout gradient field. This determination can be made using numerical optimization methods, for example. According to another embodiment variant, the optimized position and/or an optimized readout gradient can also be determined by a trained algorithm, in particular a trained deep learning model such as a neural network, for example. The computer can be any data processing device, for example, a CPU, GPU, PC, laptop, cloud computer, or mobile end device.

According to another aspect, one or more example embodiments of the present invention are directed to a computer program with program code, which triggers a magnetic resonance tomograph to execute the method described herein. The magnetic resonance tomograph can be in particular a combined MR/PET device. This allows the acquired magnetic resonance image to be used to determine AC maps and to correct PET images.

One or more example embodiments of the present invention are also directed to a non-transitory computer-readable medium, which contains a computer program described herein. The computer-readable medium is in particular a digital storage medium, for example, an optical, magnetic, or semiconductor storage medium. In particular, this can be a hard drive, cloud storage, a disk, CD-ROM, SD card, SSD card, or other memory stick.

Finally, one or more example embodiments of the present invention are also directed to a magnetic resonance tomograph that is configured to execute the method described herein, wherein the magnetic resonance tomograph comprises the following: a main magnet that produces a static magnetic field; gradient coils that are able to produce magnetic gradient fields extending in a slice selection direction, a readout direction, and at least one phase encoding direction; a radiofrequency controller configured to control a radio frequency coil, a gradient controller configured to control the gradient coils; and a control unit configured to control the radio frequency actuator and the gradient actuator. The magnetic resonance tomograph can be any commercial MR scanner, for example, a 0.5T, 1.5T, 3T, or 7T device. The magnetic resonance tomograph preferably also has a ring of PET sensors; thus, it is preferably a combined MR/PET device.

All advantages and features described in reference to the method according to embodiments of the present invention also apply to the computer program, the computer-readable medium, and the magnetic resonance tomograph, and vice versa.

BRIEF DESCRIPTION OF THE DRAWINGS

The present invention is described in more detail below using exemplary embodiments with reference to the enclosed drawings. The drawings show:

FIG. 1 a magnetic resonance tomograph according to an embodiment variant of the present invention;

DETAILED DESCRIPTION

Figure 1:
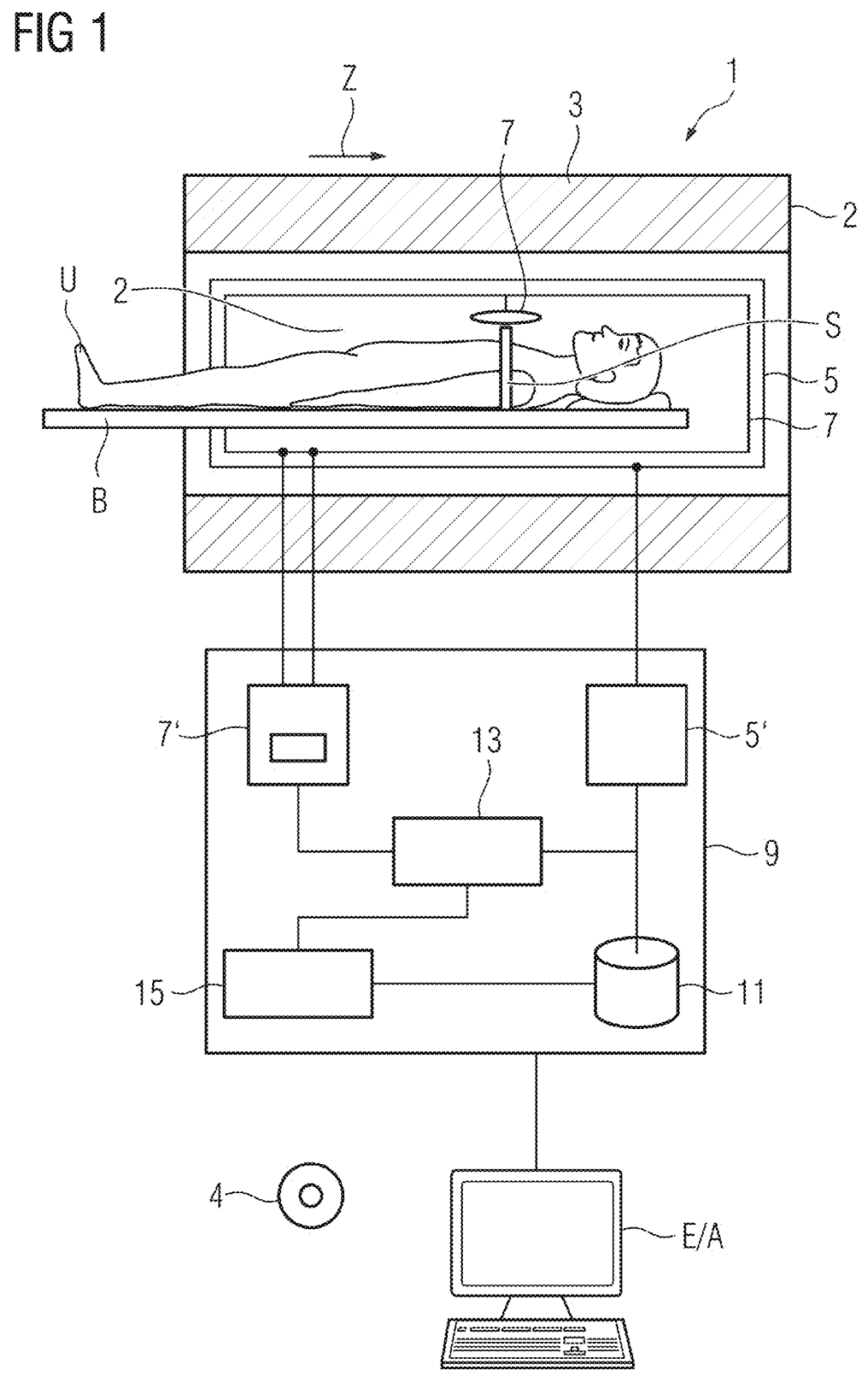
Figure 2:
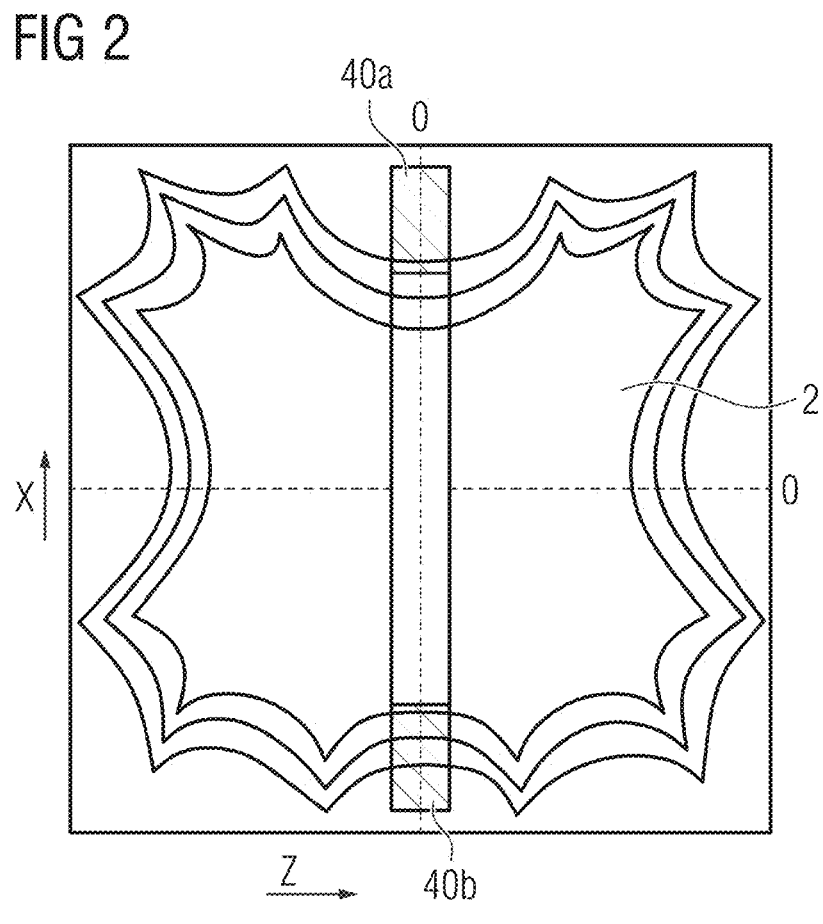
FIG. 2 an exemplary map of the static magnetic field in a magnetic resonance tomograph in the x-z plane.

FIG. 1 shows a schematic representation of a magnetic resonance tomograph, also known as the MR device 1, according to an embodiment variant of the present invention. The MR device 1 has a main magnet 3, which produces the constant magnetic field within the sensitive area 2, a gradient coil arrangement 5, which produces gradient fields, one or more radio frequency coils 7 for sending and receiving radio frequency signals (RF pulses), and a control computer 9, which is configured to perform the method according to an embodiment of the present invention. The radio frequency coils 7 can be configured as one multichannel coil arrangement with at least two coils. The MR device is preferably an MR/PET device. In this instance, PET detectors (not shown) are thus also arranged annularly around the sensitive area 2.

In order to acquire MR data for an examination subject U, for example, a patient or a phantom, the examination subject U is introduced into the sensitive area 2 of the MR device on a bed B. The represented slice S is an example of a 2D slice, from which MR data can be acquired using a method according to an embodiment variant of the present invention. The subject U on the bed B can be moved along the z-direction so that the slice S is at different heights of the body, and thus a stack of magnetic resonance images are acquired. The control computer 9 controls the MR device 1 and can control the gradient coil arrangement 5 with a gradient controller 5' and the RF coil 7 with an RF sending/receiving controller 7'. The control computer 9 also has a processor 15, which can perform the optimization steps described here. A control unit 13 of the control computer 9 is configured to perform all the controls and calculations needed to acquire the images. Interim and final results that are required for this or generated in the process can be saved in a memory 11 of the control computer 9. In particular, the optimized position in the slice selection direction and the optimized readout gradients for this MR device can be saved there and can be accessed in each case for the acquisition of the MR image. A user can enter control commands and/or view displayed results, e.g., image data, via an input/output interface E/A. A non-transitory data carrier 4 can be loaded in the control computer 9, which can be coded with programming instructions (program code), which trigger the control computer 9 and its various functional units described above to execute one or all embodiment variants of the method according to an embodiment of the present invention.

Figure 3:
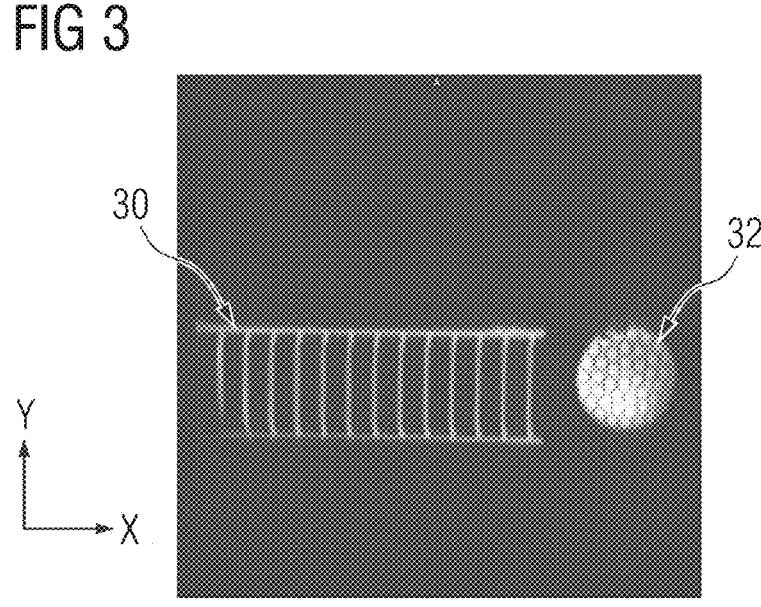
FIG. 3 an axial magnetic resonance image of a phantom at the position z=0.
Figure 4:
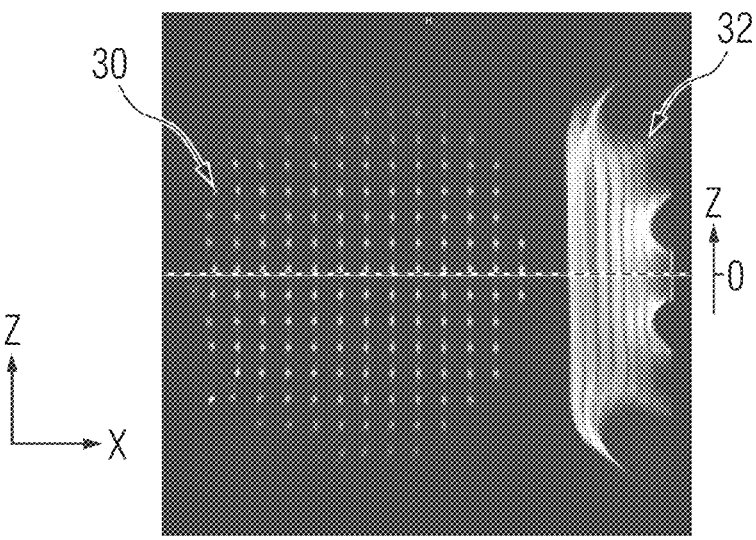
FIG. 4 a coronal magnetic resonance image of the phantom in FIG. 3.

FIG. 2 shows a schematic representation of the course of the main magnetic field of a magnetic resonance tomograph 1 in the sensitive area 2 in the x-z plane. The strength of the main magnetic field is indicated by contour lines. It is clear that there are strong fluctuations in the main magnetic field at the edges of the sensitive area 2. Where z=0, this is a local maximum of the static magnetic field, which can cause significant distortion, as illustrated in FIGS. 3 and 4. FIG. 2 also shows the field of view of the slice S and the predetermined regions 40a, 40b in the periphery of the field of view of the slice S. According to one or more example embodiments of the present invention, the position of this slice S is optimized in the z-direction.

FIG. 3 shows a magnetic resonance image of an axial slice through a particular phantom, which is arranged in the sensitive area 2. The phantom comprises on the one hand a part 30 with small upright tubes filled with fluid in a grid-like arrangement. An arm phantom 32 is positioned to the right of this. This arm phantom 32 comprises a number of small tubes arranged in parallel in a larger tube filled with fluid. FIG. 4 shows the same phantom in a coronal slice. FIG. 4 clearly shows that there are severe distortions at the edge of the sensitive area 2. These distortions vary greatly in the z-direction; they cause severe expansion of the image where z=0 and severe compression just a few centimeters further from this in the z-direction. According to one embodiment variant of the present invention, a position is thus selected in the z-direction at which there is an optimal homogeneity of the static magnetic field precisely in this peripheral region.

Figure 5:
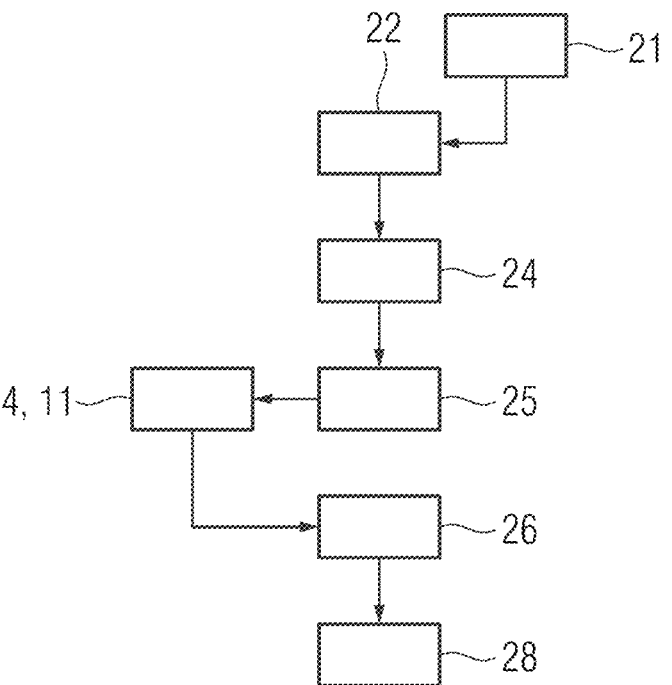
FIG. 5 a schematic flow chart of a method according to an embodiment variant of the present invention.

One example of the method, according to one or more example embodiments of the present invention, is illustrated in FIG. 5. First, a distortion correction function for the extended field of view is received in step 22. This can be simulated or be produced from a map of the readout gradient field 21 produced by the magnetic resonance tomograph (optional step). In step 24 an optimized position is determined along the slice selection direction with a high level of homogeneity in the predetermined region(s). In step 25 an optimized readout gradient is determined for the predetermined region(s) within a slice at this optimized position. These optimized values are saved in a memory 4 or 11. At a later point in time, in step 26 a magnetic resonance image is then acquired of a patient using the optimized values from the memory 4 or 11. The distortion in the magnetic resonance image is corrected in step 28. Such an image can then be used to create an AC map, for example. This AC map can be used for attenuation correction of PET images that have been taken on this device.

Figure 6:
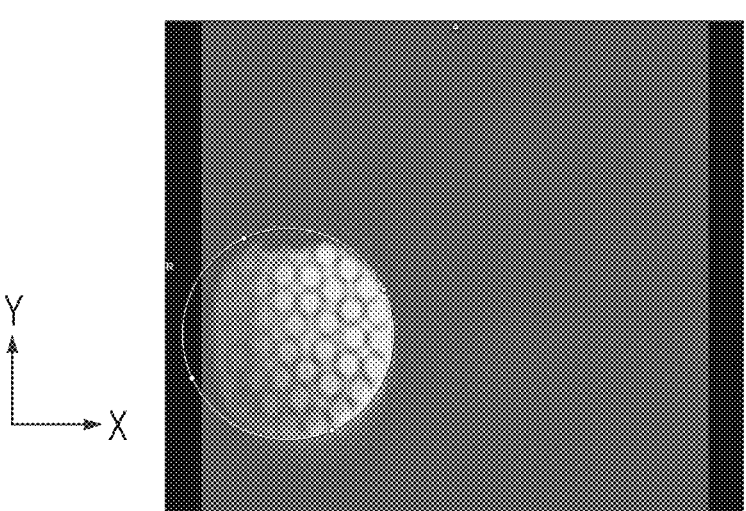
FIG. 6 an axial magnetic resonance image of a phantom, acquired with a method according to an embodiment variant of the present invention.
Figure 7:
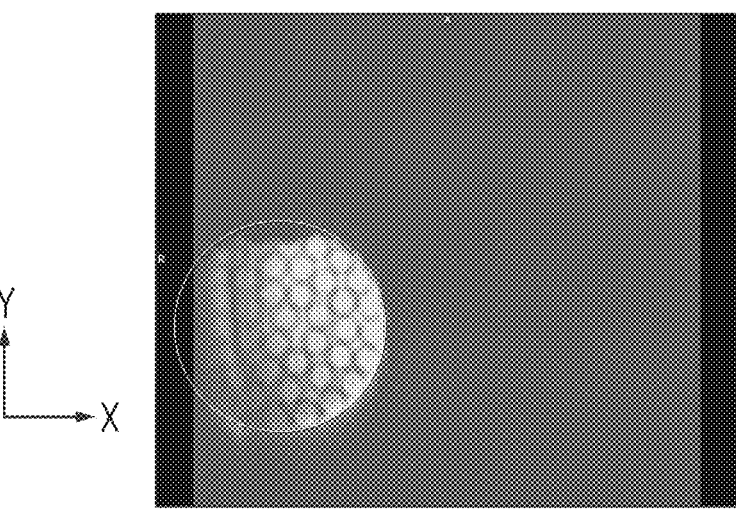
FIG. 7 an axial magnetic resonance image of the same phantom as in FIG. 6, acquired with a conventional method.

FIGS. 6 and 7 show a comparison between the proposed technique (FIG. 6) and the conventional HUGE method (FIG. 7). An axial magnetic resonance image of the arm phantom 32 is represented. It should be noted that the proposed method reduces both image artifacts and distortions compared to the conventional HUGE method.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "on," "connected," "engaged," "interfaced," and "coupled." Unless explicitly described as being "direct," when a relationship between first and second elements is described in the disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" on, connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed above. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. The present invention may, however, be embodied in many alternate forms and should not be construed as limited to only the embodiments set forth herein.

In addition, or alternative, to that discussed above, units and/or devices according to one or more example embodiments may be implemented using hardware, software, and/or a combination thereof. For example, hardware devices may be implemented using processing circuitry such as, but not limited to, a processor, Central Processing Unit (CPU), a Graphics Processing Unit (GPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one example embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

What is claimed is:

1. A method for acquiring, with a magnetic resonance tomograph, a magnetic resonance image with an extended field of view that is extended in at least one direction, wherein the magnetic resonance tomograph is configured to, in the extended field of view, produce a static magnetic field and magnetic gradient fields extending in a slice selection direction, a readout direction, and at least one phase encoding direction, wherein during acquisition, an MR signal is acquired from signal-generating spins in the extended field of view, and wherein the method comprises:

provisioning a distortion correction function for the extended field of view;

provisioning at least one optimized position along the slice selection direction, wherein the static magnetic field has a level of homogeneity within a slice at the at least one optimized position in at least one region in a periphery of the extended field of view;

provisioning an optimized readout gradient, wherein a strength and a polarity of the optimized readout gradient are selected so that distortions in the magnetic resonance image caused by inhomogeneities in the static magnetic field and distortions caused by nonlinearities in a readout gradient field are superimposed in a compensatory manner within the at least one region;

acquiring the magnetic resonance image at the at least one optimized position along the slice selection direction with the optimized readout gradient; and performing distortion correction on the magnetic resonance image using the distortion correction function.

2. The method as claimed in claim 1, wherein the readout direction is aligned along a left-right direction of a subject lying in the magnetic resonance tomograph, and the slice selection direction is aligned along a z-direction of the magnetic resonance tomograph.

3. The method as claimed in claim 1, wherein the at least one optimized position along the slice selection direction is selected so that the static magnetic field has a level of homogeneity within the slice at the at least one optimized position in two regions, and the two regions are positioned on sides of the extended field of view in the readout direction.

4. The method as claimed in claim 1, wherein two optimized positions along the slice selection direction are selected so that the static magnetic field has a level of homogeneity within a first region of a first slice at a first optimized position and a level of homogeneity within a second region of a second slice at a second optimized position, and the first region and the second region are arranged on sides of the extended field of view in the readout direction.

5. The method as claimed in claim 1, wherein the at least one optimized position along the slice selection direction is further optimized to minimize artifacts due to signal-generating spins outside the slice.

6. The method as claimed in claim 1, wherein the at least one optimized position is determined by analyzing a different magnetic resonance image, which was obtained in a plane that is aligned along the slice selection direction and the readout direction, and determining, as the at least one optimized position, a position along the slice selection direction in which a distortion of the different magnetic resonance image is minimal at the periphery of the extended field of view in the readout direction.

7. The method as claimed in claim 1, wherein the optimized readout gradient is determined by applying $B_0$ homogenization using gradient enhancement.

8. The method as claimed in claim 1, further comprising:

providing an optimized slice selection gradient with respect to a slice thickness used during acquisition of the magnetic resonance image, wherein a strength and a polarity of a slice selection gradient are optimized to minimize interfering signals from spins outside the slice.

9. The method as claimed in claim 8, wherein at least one of the at least one optimized position or the optimized strength and the optimized polarity of the optimized slice selection gradient are determined by evaluating magnetic resonance images, which are corrected for the extended field of view using the distortion correction function.

10. The method as claimed in claim 1, further comprising:

acquiring a magnetic resonance image separately for each of two regions at an edge of the extended field of view on sides in the readout direction.

11. The method as claimed in claim 1, further comprising:

acquiring a series of magnetic resonance images at the at least one optimized position along the slice selection direction, wherein a subject lying in the magnetic resonance tomograph is moved along the slice selection direction between acquisition of individual images in the series.

12. A method of producing an attenuation correction (AC) map of a subject, the method comprising:

using a magnetic resonance image with an extended field of view to produce the AC map, the magnetic resonance tomograph obtained using the method as claimed in claim 1.

13. A non-transitory computer program product including program code that, when executed by at least one processor at a magnetic resonance tomograph, triggers the magnetic resonance tomograph to execute the method as claimed in claim 1.

14. A non-transitory computer-readable storage medium, storing computer-executable instructions that, when executed by at least one processor at a magnetic resonance tomograph, cause the magnetic resonance tomograph to perform the method as claimed in claim 1.

15. A magnetic resonance tomograph configured to execute the method as claimed in claim 1, wherein the magnetic resonance tomograph comprises:

a main magnet configured to produce the static magnetic field;

gradient coils configured to produce the magnetic gradient fields extending in the slice selection direction, the readout direction, and the at least one phase encoding direction;

a gradient controller configured to control the gradient coils;

a radio frequency controller configured to control a radio frequency coil; and a control unit configured to control the radio frequency controller and the gradient controller.

16. The method as claimed in claim 2, wherein the at least one optimized position along the slice selection direction is selected so that the static magnetic field has a level of homogeneity within the slice at the at least one optimized position in two regions, and the two regions are positioned on sides of the extended field of view in the readout direction.

17. The method as claimed in claim 2, wherein two optimized positions along the slice selection direction are selected so that the static magnetic field has a level of homogeneity within a first region of a first slice at a first optimized position and a level of homogeneity within a second region of a second slice at a second optimized position, and the first region and the second region are arranged on sides of the extended field of view in the readout direction.

18. The method as claimed in claim 17, wherein the at least one optimized position is determined by analyzing a different magnetic resonance image, which was obtained in a plane that is aligned along the slice selection direction and the readout direction, and determining, as the at least one optimized position, a position along the slice selection direction in which a distortion of the different magnetic resonance image is minimal at the periphery of the extended field of view in the readout direction.

19. The method as claimed in claim 4, wherein the at least one optimized position along the slice selection direction is further optimized to minimize artifacts due to signal-generating spins outside the slice.

20. The method as claimed in claim 4, wherein the at least one optimized position is determined by analyzing a different magnetic resonance image, which was obtained in a plane that is aligned along the slice selection direction and the readout direction, and determining, as the at least one optimized position, a position along the slice selection direction in which a distortion of the different magnetic resonance image is minimal at the periphery of the extended field of view in the readout direction.

21. The method as claimed in claim 1, wherein the distortion correction function for the extended field of view is based on a map of a gradient field which covers the extended field of view.

* * * * *